United States Patent
Khellah et al.

(10) Patent No.: US 6,831,871 B2
(45) Date of Patent: Dec. 14, 2004

(54) STABLE MEMORY CELL READ

(75) Inventors: Muhammad M. Khellah, Lake Oswego, OR (US); Dinesh Somasekhar, Hillsboro, OR (US); Yibin Ye, Portland, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/334,456

(22) Filed: Dec. 30, 2002

(65) Prior Publication Data

US 2004/0125677 A1 Jul. 1, 2004

(51) Int. Cl.[7] ............................................. G11C 7/00
(52) U.S. Cl. ...................... 365/203; 365/204; 365/190
(58) Field of Search ............................. 365/203, 204, 365/190, 154

(56) References Cited

U.S. PATENT DOCUMENTS 5,864,511 A * 1/1999 Sato ........................ 365/203
6,333,881 B1 * 12/2001 Kusunoki et al. ........... 365/203
6,341,095 B1 * 1/2002 Lee et al. ................... 365/203
2001/0038562 A1 * 11/2001 Rohr et al. .................. 365/203

OTHER PUBLICATIONS

Bhavnagarwala et al.; "Dynamic–Threshold CMOS SRAM Cells for Fast, Portable Applications"; 0–70803–6598–4; ©2000 IEEE; pp. 359–363.

Bhavnagarwala et al; "The Impact of Intrinsic Device Fluctuations on CMOS SRAM Cell Stability"; IEEE Journal of Solid–State Circuits; vol. 36, No. 4; Apr. 2001; 0018–9200; pp. 658–665.

* cited by examiner

Primary Examiner—Huan Hoang
(74) Attorney, Agent, or Firm—Buckley, Maschoff & Talwalkar LLC (57) ABSTRACT

According to some embodiments, provided are a memory cell, a bit-line coupled to the memory cell, a pre-charge circuit coupled to the bit-line to pre-charge the bit-line, and a discharge device coupled to the bit-line to discharge the bit-line prior to a read of the memory cell.

18 Claims, 7 Drawing Sheets

Prior Art

FIG. 1

Prior Art

STABLE MEMORY CELL READ

BACKGROUND

Many Static Read-Only Memory (SRAM) designs provide high read/write speeds and low power consumption. SRAM is therefore particularly suited for implementation as a microprocessor cache. However, shrinking dimensions of transistors used to implement SRAM and variability in a number and location of their channel dopant atoms may result in problematic variations in the transistors' threshold voltages.

Figure 1:
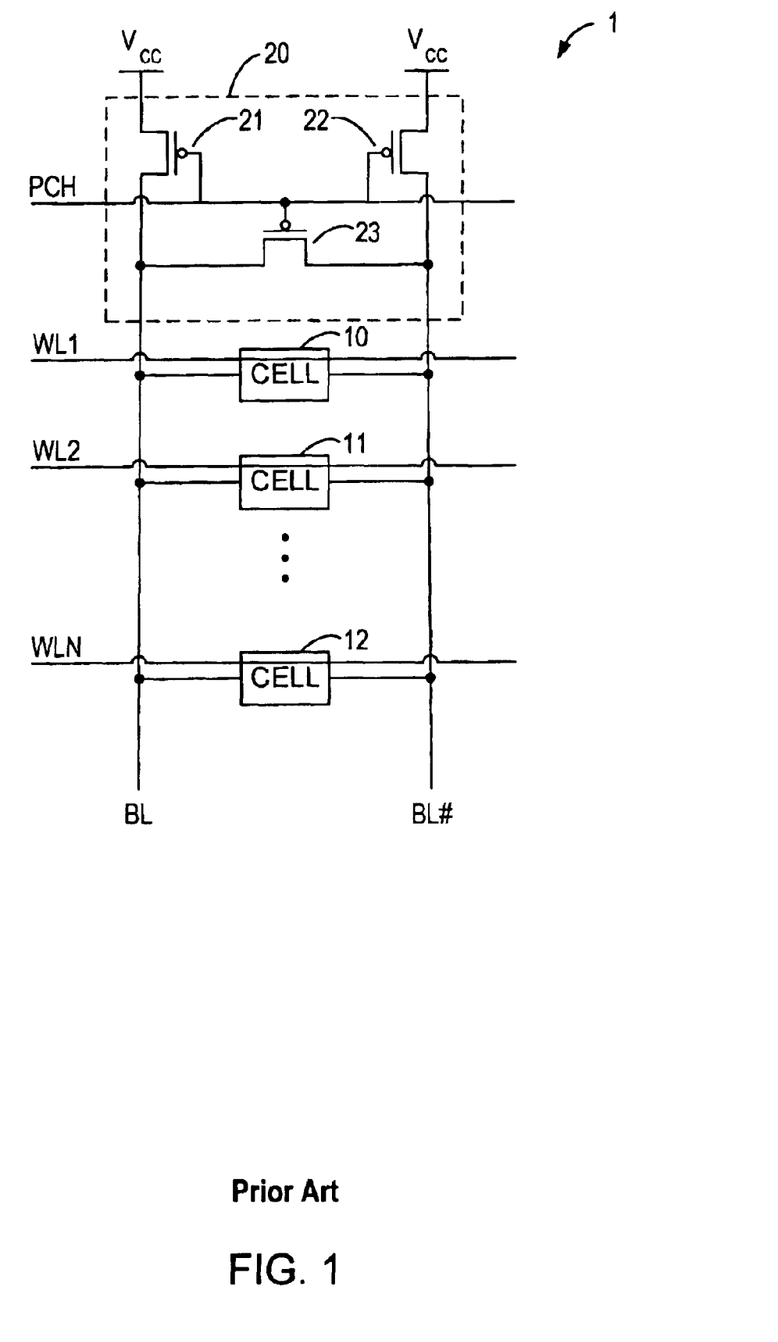
FIG. 1 is a schematic diagram illustrating a conventional SRAM architecture.

These variations may reduce the stability of an SRAM cell during a read operation. In this regard, SRAM stability generally refers to a probability that an SRAM cell will flip its content during a read operation. FIG. 1 illustrates a conventional SRAM architecture for use in describing this phenomenon.

More particularly, architecture 1 comprises a portion of one column of a conventional SRAM block. Architecture 1 includes memory cells 10, 11 and 12, as well as other unshown memory cells disposed between memory cells 11 and 12. Each memory cell is coupled to bit-line BL and to complementary bit-line BL#. Each memory cell is also coupled to a respective one of word-lines WL1, WL2 and WLN, which provide a signal to allow read or write access to a respective memory cell.

Bit-line BL and complementary bit-line BL# are each coupled to pre-charge circuit 20. Pre-charge circuit 20 includes p-channel metal oxide semiconductor (PMOS) transistors 21 through 23. A source terminal of each of PMOS transistors 21 and 22 is coupled to a supply voltage ($V_{cc}$), and a gate terminal of each of transistors 21 and 22 is coupled to a pre-charge (PCH) signal line. A drain terminal of PMOS transistor 21 is coupled to bit-line BL and a drain terminal of PMOS transistor 22 is coupled to complementary bit-line BL#. Lastly, a gate terminal of PMOS transistor 23 is also coupled to the PCH signal line, with either one of a drain and/or a source of PMOS transistor 23 coupled to one of bit-line BL and complementary bit-line BL#.

Pre-charge circuit 20 operates to charge bit-line BL and complementary bit-line BL# to in response to the PCH signal. In a case that the PCH signal is enabled (active low), transistors 21 and 22 electrically connect bit-line BL and complementary bit-line BL# to the supply voltage. Additionally, transistor 23 connects bit-line BL and complementary bit-line BL# to equalize the potentials thereof.

Figure 2:
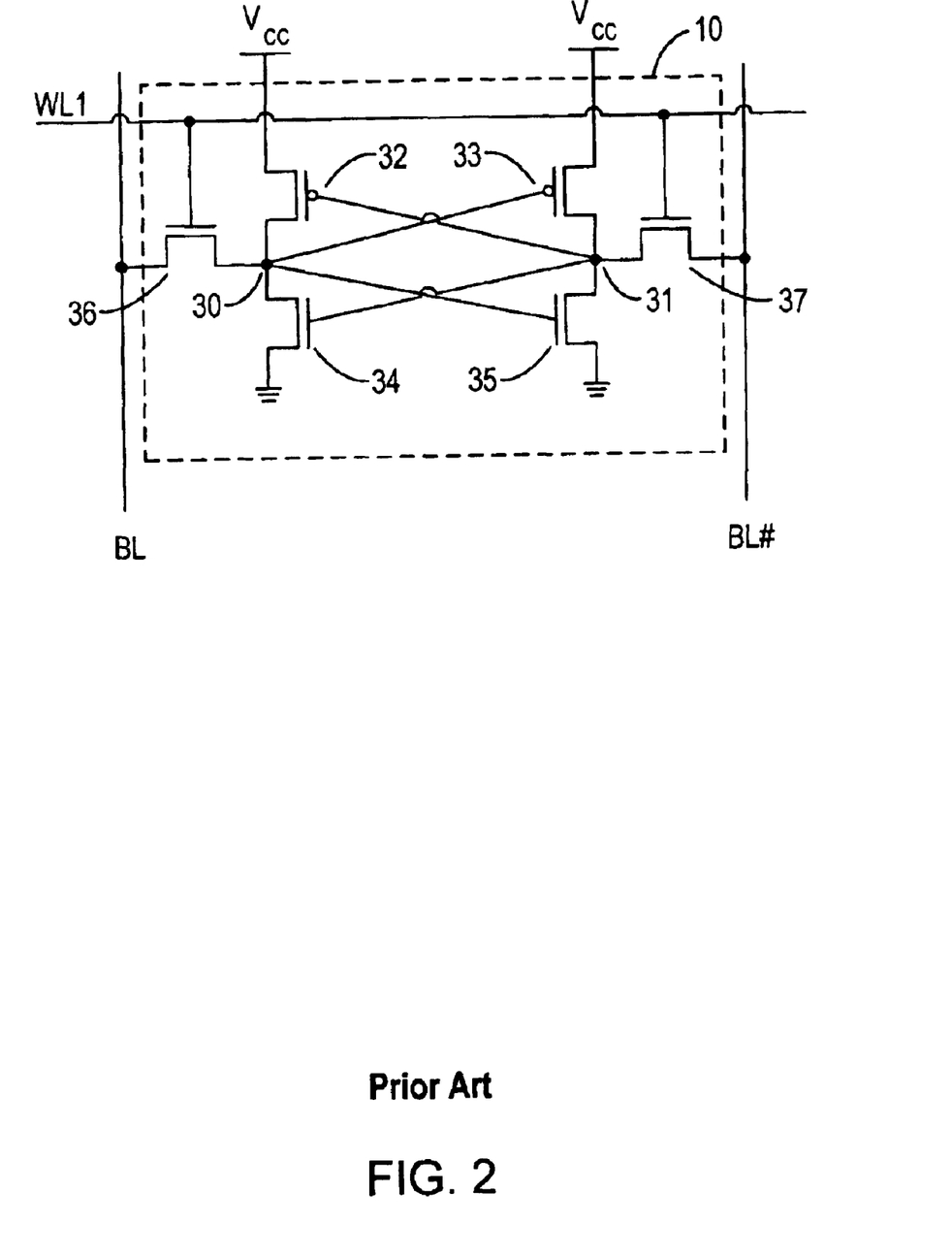
FIG. 2 is a schematic diagram illustrating a conventional SRAM memory cell.

To read a value stored in a memory cell, a word-line associated with the memory cell is enabled after the bit-lines BL and BL# have been pre-charged. Sense amplifiers coupled to the bit-lines then monitor a difference between voltages on the bit-lines to determine the stored value. FIG. 2 is a detailed view of a conventional six-transistor (6T) SRAM memory for purposes of explaining the read operation and the problem of cell instability.

FIG. 2 shows elements of SRAM memory cell 10. Nodes 30 and 31 provide complementary bit values by virtue of the illustrated architecture. According to convention, the bit value at node 30 is considered to be the value stored by cell 10.

Memory cell 10 includes pull-up PMOS transistors 32 and 33, as well as pull-down n-channel metal oxide semiconductor (NMOS) transistors 34 and 35. Cell 10 also includes NMOS access transistor 36, which is coupled to bit-line BL and to node 30. NMOS access transistor 37 is similarly coupled to complementary bit-line BL# and to node 31. A gate terminal of each of access transistors 36 and 37 is coupled to word-line WL1. Accordingly, enabling word-line WL1 (active high) electrically connects bit-line BL to node 30 and complementary bit-line BL# to node 31.

The foregoing description of a read operation will assume that a bit value at node 30 is "1" ($V_{30}$ $V_{cc}$) and a bit value at node 31 is "0" ($V_{31}$ 0). Consequently, transistor 32 is turned on and transistor 34 is turned off by the voltage at node 31, thereby holding the voltage at node 30 to $V_{cc}$. Similarly, the voltage at node 30 turns off transistor 33 and turns on transistor 35, thereby coupling node 31 to ground.

At the beginning of a read operation, bit-lines BL and BL# are pre-charged to the supply voltage by enabling the PCH signal. The PCH signal is disabled and the word-line WL1 signal is enabled to electrically connect bit-line BL to node 30 and complementary bit-line BL# to node 31. Since both bit-line BL and node 30 were charged to the supply voltage prior to enabling the word-line WL1 signal, the voltage on bit-line BL remains substantially unchanged. However, the voltage on bit-line BL will dip due to its direct path through transistors 37 and 35 to ground. The aforementioned sense amplifiers coupled to the column of FIG. 1 sense the resulting difference between the voltages on bit-line BL and complementary bit-line BL# in order to determine that memory cell 10 stores a bit value of "1".

As the voltage on complementary bit-line BL# dips below the supply voltage, the voltage at node 31 will rise above ground due to the voltage divider composed of transistors 37 and 35. In some scenarios, the voltage at node 31 may rise to a level that causes cell 10 to "flip" its value and store a "0" rather than a "1". Such a result should not be caused by a read operation, and is conventionally addressed by lowering the resistance of transistor 35 with respect to the resistance of transistor 37.

It has been proposed to lower the relative resistances by increasing the width of the pull-down NMOS transistors, which increases the size of the memory cell. Other proposals increase the length of the access transistors, which decreases the speed at which the memory cell can be read. More complex approaches increase the strength of the pull-down transistors by driving their source terminals to a negative voltage while or before the word-line signal is enabled, or reduce the strength of the access transistors by pre-charging the bit-lines to a voltage that is slightly lower than the supply voltage. Both of these latter approaches require additional voltage sources and corresponding area and power overhead.

DETAILED DESCRIPTION

Figure 3:
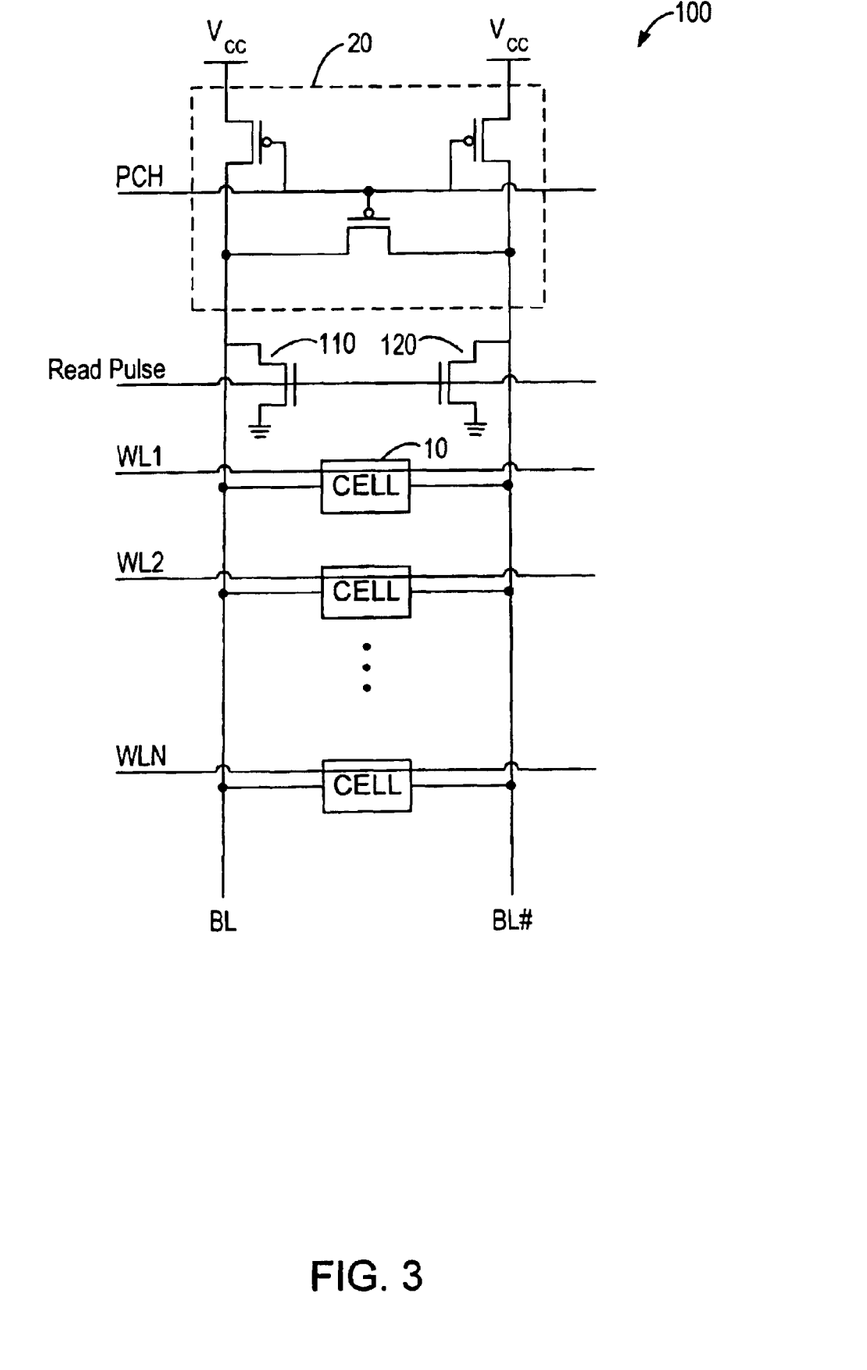
FIG. 3 is a schematic diagram illustrating an SRAM architecture according to some embodiments.

FIG. 3 is a schematic diagram of a portion of an SRAM architecture according to some embodiments. Architecture 100 is identical to architecture 1 of FIG. 1 except for the presence of NMOS transistors 110 and 120, and the Read Pulse signal line coupled to the gates thereof. Drain terminals of NMOS transistors 110 and 120 are coupled to bit-lines BL and BL#, respectively, and source terminals of NMOS transistors 110 and 120 are coupled to ground.

Generally, NMOS transistors 110 and 120 may operate to discharge bit-lines BL and BL# prior to reading a memory cell. In this regard, a Read Pulse signal may be applied on the Read Pulse signal line to turn on NMOS transistors 110 and 120 after bit-lines BL and BL# have been pre-charged to the supply voltage and before a word-line signal associated with the memory cell is enabled. Such a process may result in voltages on the bit-lines that are slightly (100 mV–300 mV) less than the supply voltage prior to enabling the word-line signal. These lower voltages may reduce a possibility that the read operation will cause the memory cell to "flip".

Figure 4:
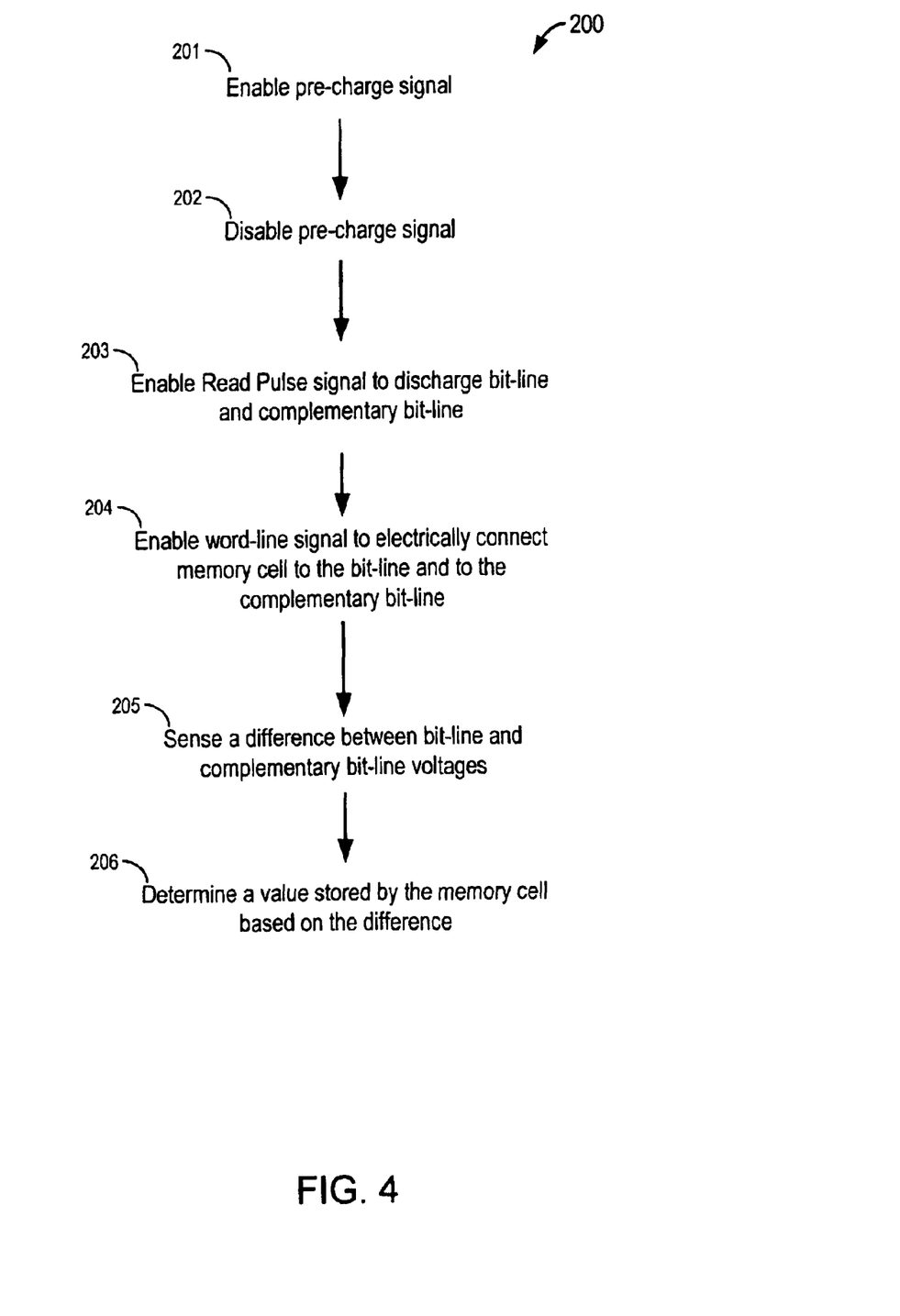
FIG. 4 is a flow diagram of process steps to read a memory cell according to some embodiments.

FIG. 4 is a flow diagram of process steps 200 to read a memory cell according to some embodiments. Process steps 200 may be executed by any configuration of any elements for controlling architecture 100, including any combination of hardware, software and firmware. Although process steps 200 may be executed in conjunction with many architectures, process steps 200 will be described below with respect to architecture 100.

Figure 5:
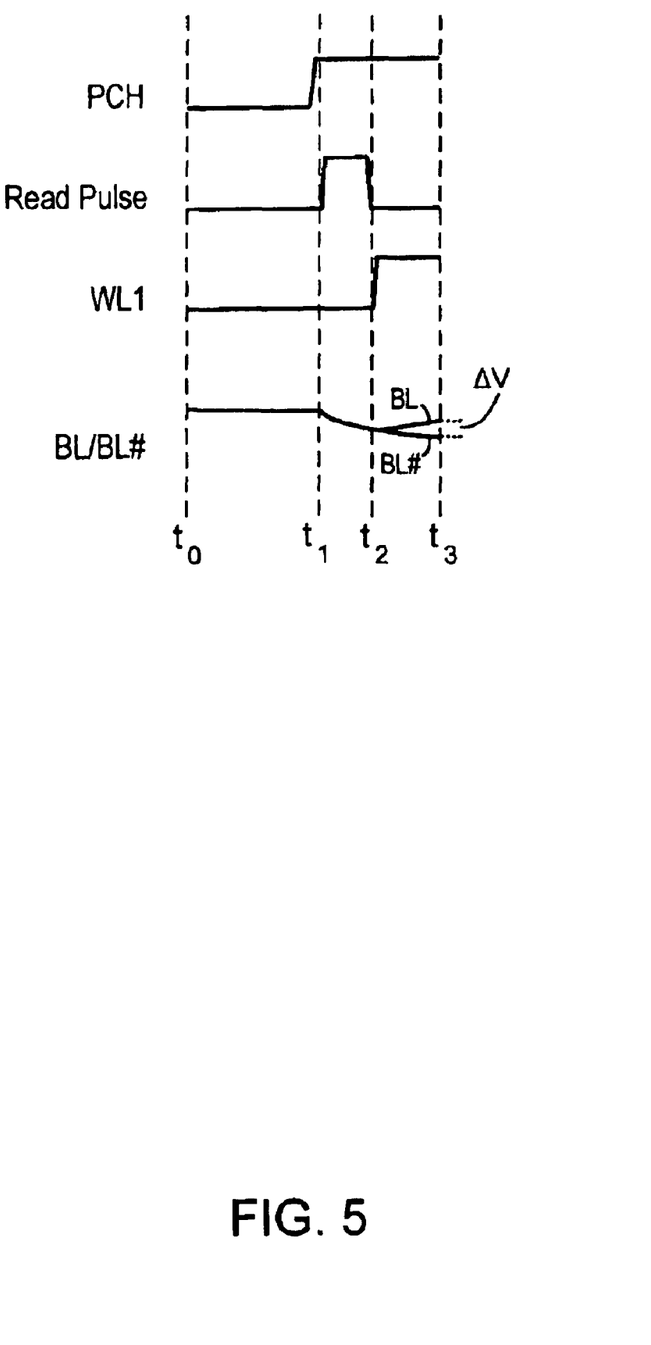
FIG. 5 is a timing diagram of signals used during a read operation according to some embodiments.

In order to read a value stored by memory cell 10, the PCH signal is enabled in step 201. FIG. 5 is a timing diagram of signals according to some embodiments of process steps 200. FIG. 5 shows the PCH signal enabled at time $t_0$. Again, the PCH signal is active when low because pre-charge circuit 20 is composed of PMOS transistors.

Enabling the PCH signal pre-charges bit-line BL and complementary bit-line BL# to the supply voltage. Accordingly, the FIG. 5 waveform depicting both of bit-line BL and complementary bit-line BL# indicates that these bit-lines are pre-charged to the supply voltage at time $t_0$. Of course, depending on the voltages that are present on bit-lines BL and BL# prior to time $t_0$, some delay may exist between time $t_0$ and a time at which bit-lines BL and BL# are fully pre-charged to the supply voltage.

Next, in step 202, the PCH signal is disabled. FIG. 5 shows that the PCH signal is disabled at time $t_1$. After the PCH signal is disabled, the Read Pulse signal is enabled and applied to the gates of transistors 110 and 120 in step 203. Enabling the Read Pulse signal causes bit-line BL and complementary bit-line BL# to begin discharging at time $t_1$.

The Read Pulse signal is disabled at time $t_2$, at which time bit-line BL and complementary bit-line BL# have discharged some voltage Δ. According to some embodiments in which the supply voltage is +5V, $t_2-t_1$ is determined such that Δ=100 to 300 mV.

Word-line signal WL1 associated with memory cell 10 is enabled at time $t_2$ in step 204. As described with respect to FIG. 2, enabling word-line signal WL1 electrically connects memory cell 10 to bit-lines BL and BL#. Assuming that a "1" is present at node 30 and a "0" is present at node 31, this electrical connection causes the voltage on complementary bit-line BL# to decrease (due to the difference between 0V at node 31 and $V_{cc}-\Delta$ on complementary bit-line BL#). The electrical connection may also cause the voltage on bit-line BL to increase if Δ is less than the threshold voltage of transistor 36. Voltages at nodes 30 and 31 also may decrease and increase, respectively. According to some embodiments, the increase in the voltage at node 31 is less than that experienced by conventional systems, thereby providing greater cell stability than conventional systems.

FIG. 5 illustrates a scenario in which the voltage on bit-line BL increases and the voltage on complementary bit-line BL# decreases after time $t_2$ in response to the enabled word-line signal WL1. A difference between these two voltages at time $t_3$ is shown as ΔV. The difference ΔV is sensed in step 205 by sense amplifiers coupled to bit-line BL and complementary bit-line BL#. Based on the sensed difference ΔV, a value stored by memory cell 10 is determined in step 206. According to the present example, the value is determined to be "1" because the voltage on bit-line BL is greater than the voltage on complementary bit-line BL#.

Figure 6:
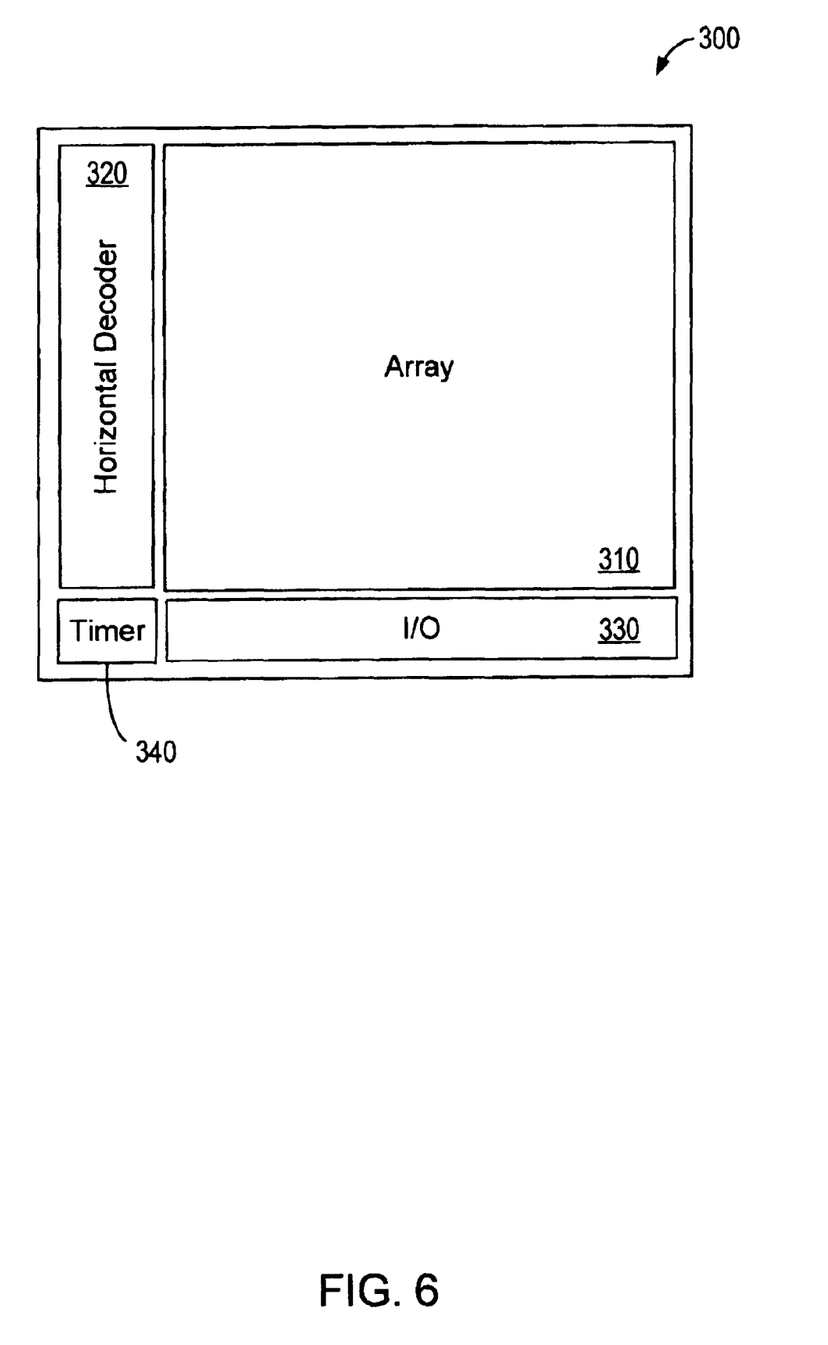
FIG. 6 is a block diagram of an SRAM block according to some embodiments.

FIG. 6 is a block diagram of SRAM block 300 according to some embodiments. SRAM block 300 includes array 310, horizontal decoder 320, I/O unit 330 and timer 340. Array 310 may include many columns such as that shown in FIG. 3. More particularly, a 32 kB SRAM block may includes 256 columns of 128 memory cells each.

Horizontal decoder 320 controls the enabling and disabling of the word-line signal lines associated with each of the 128 rows of memory cells. I/O unit 330 includes sense amplifiers for sensing voltage differences on corresponding bit-lines and write drivers for controlling writing of values to selected memory cells. In some embodiments, a sense amplifier and a write driver are shared among eight columns of array 310, and address coding is used to select one column of interest from the eight columns. I/O unit 330 may also include devices to control the PCH signal, the Read Pulse signal, and a column select signal used by the sense amplifiers and write drivers. In this regard, timer 340 may provide suitable timing for the PCH signal, the Read Pulse signal, and the column select signal.

Figure 7:
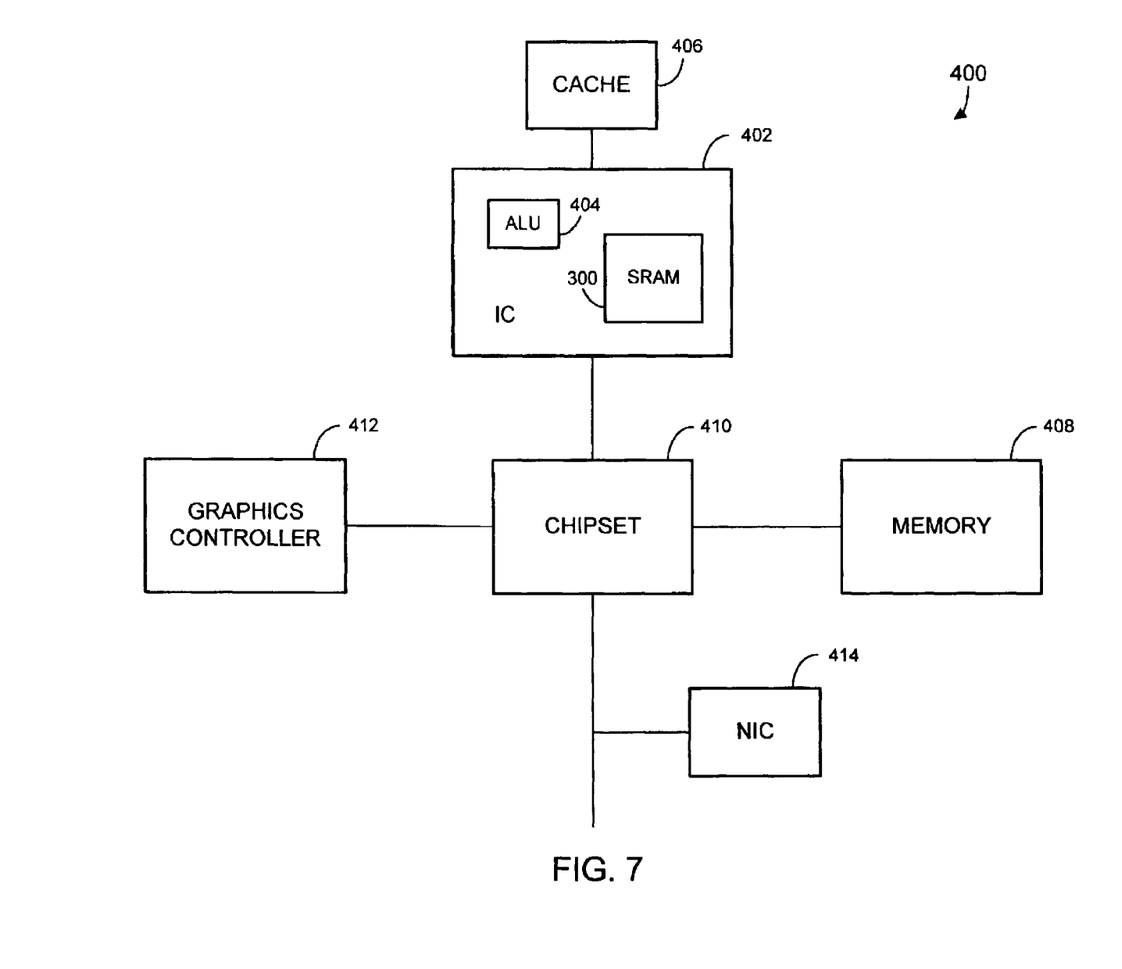
FIG. 7 is a block diagram of a system according to some embodiments.

FIG. 7 illustrates a block diagram of system 400 according to some embodiments. System 400 includes integrated circuit 402 comprising sub-blocks such as arithmetic logic unit (ALU) 404 and SRAM block 300, which serves as an on-die cache. Integrated circuit 402 may be a microprocessor or another type of integrated circuit. Integrated circuit 402 communicates with off-die cache 406 according to some embodiments. Off-die cache 406 may also comprise an SRAM block such as SRAM block 300. Integrated circuit 402 may communicate with system memory 408 via a host bus and chipset 410. Other off-die functional units, such as graphics controller 412 and Network Interface Controller (NIC) 414, may communicate with integrated circuit 402 via appropriate busses or ports.

The several embodiments described herein are solely for the purpose of illustration. Embodiments may include any currently or hereafter-known versions of the elements described herein. Therefore, persons skilled in the art will recognize from this description that other embodiments may be practiced with various modifications and alterations.

What is claimed is:

1. A circuit comprising:
   a memory cell;
   a bit-line coupled to the memory cell;
   a complementary bit-line coupled to the memory cell;
   a pre-charge circuit coupled to the bit-line and to the complementary bit-line, the pre-charge circuit to pre-charge the bit-line and the complementary bit-line to a reference voltage;
   a device coupled to the bit-line to discharge the bit-line to a different voltage that is different from the reference voltage during a read operation; and
   a second device coupled to the complementary bit-line to discharge the complementary bit-line to the different voltage during the read operation,
   wherein only one of the bit-line and the complementary bit-line is discharged to a voltage that is less than the different voltage during the read operation.

2. A circuit according to claim 1, the pre-charge circuit comprising:
   a PMOS transistor, a source of the PMOS transistor coupled to a supply voltage, a gate of the PMOS transistor coupled to a pre-charge signal line, and a drain of the PMOS transistor coupled to the bit-line and to the device.

3. A circuit according to claim 2, the device comprising:
   an NMOS transistor, a drain of the NMOS transistor coupled to the pre-charge circuit and to the bit-line, a gate of the NMOS transistor coupled to a read pulse signal line, and a source of the NMOS transistor coupled to ground.

4. A circuit according to claim 1, the device comprising:
   an NMOS transistor, a drain of the NMOS transistor coupled to the pre-charge circuit and to the bit-line, a gate of the NMOS transistor coupled to a read pulse signal line, and a source of the NMOS transistor coupled to ground.

5. A circuit according to claim 1, wherein the pre-charge circuit comprises:
   a first PMOS transistor, a source of the first PMOS transistor coupled to a supply voltage, a gate of the first PMOS transistor coupled to a pre-charge signal line, and a drain of the first PMOS transistor coupled to the bit-line and to the device;
   a second PMOS transistor, a source of the second PMOS transistor coupled to the supply voltage, a gate of the second PMOS transistor coupled to the pre-charge signal line, and a drain of the second PMOS transistor coupled to the complementary bit-line and to the second device; and
   a third PMOS transistor, a gate of the third PMOS transistor coupled to the pre-charge signal line, a source of the third PMOS transistor coupled to one of the bit-line and the complementary bit-line, and a drain of the third PMOS transistor coupled to the other one of the bit-line and the complementary bit-line.

6. A circuit according to claim 5, wherein the device comprises:
   a first NMOS transistor, a drain of the first NMOS transistor coupled to the bit-line, a gate of the first NMOS transistor coupled to a read pulse signal line, and a source of the first NMOS transistor coupled to ground, and
   wherein the second device comprises:
   a second NMOS transistor, a drain of the second NMOS transistor coupled to the complementary bit-line, a gate of the second NMOS transistor coupled to the read pulse signal line, and a source of the second NMOS transistor coupled to ground.

7. A circuit according to claim 1, further comprising:
   a word-line coupled to the memory cell, the word-line to provide a signal to allow read or write access to the memory cell.

8. A method comprising:
   enabling a pre-charge signal to pre-charge a bit-line coupled to a memory cell and a complementary bit-line coupled to the memory cell to a reference voltage;
   disabling the pre-charge signal;
   enabling a read pulse signal to discharge the bit-line and the complementary bit-line to a different voltage that is different from the reference voltage; and
   enabling a word-line signal to electrically connect the memory cell to the bit-line and to the complementary bit-line,
   wherein enabling the word-line signal causes only one of the bit-line and the complementary bit-line to be discharged to a voltage that is less than the different voltage during a read operation.

9. A method according to claim 8, further comprising:
   sensing a difference between a voltage on the bit-line and a voltage on the complementary bit-line; and
   determining a value stored by the memory cell based on the difference.

10. A method according to claim 8, wherein the read pulse signal is enabled to discharge the bit-line and the complementary bit-line such that a value stored by the memory cell is stable when the memory cell is electrically connected to the bit-line and to the complementary bit-line.

11. A method according to claim 8, wherein the read pulse signal is enabled to charge the bit-line and the complementary bit-line such that a value stored by the memory cell is stable when the memory cell is electrically connected to the bit-line and to the complementary bit-line.

12. Processor-executable process steps stored on a medium, the process steps comprising:
   a step to enable a pre-charge signal to pre-charge a bit-line coupled to a memory cell and a complementary bit-line coupled to the memory cell to a reference voltage;
   a step to disable the pre-charge signal;
   a step to enable a read pulse signal to discharge the bit-line and the complementary bit-line to a different voltage that is different from the reference voltage; and
   a step to enable a word-line signal to electrically connect the memory cell to the bit-line and to the complementary bit-line, wherein enabling the word-line signal causes only one of the bit-line and the complementary bit-line to be discharged to a voltage that is less than the different voltage during a read operation.

13. Processor-executable process steps according to claim 12, the process steps further comprising:

a step to sense a difference between a voltage on the bit-line and a voltage on the complementary bit-line; and a step to determine a value stored by the memory cell based on the difference.

14. A circuit to pre-charge a bit-line and a complementary bit-line coupled to a memory cell to a reference voltage, to discharge the bit-line and the complementary bit-line to a different voltage that is different from the reference voltage, and to sense a difference between a voltage on the bit-line and a second voltage on the complementary bit-line, wherein one of the voltage and the second voltage is less than the different voltage, and wherein the other one of the voltage and the second voltage is greater than the different voltage.

15. A circuit according to claim 14, the circuit further to determine a value stored by the memory cell based on the difference.

16. A circuit according to claim 14, comprising:

a first NMOS transistor to discharge the bit-line, a drain of the first NMOS transistor coupled to the bit-line, a gate of the first NMOS transistor coupled to a read pulse signal line, and a source of the first NMOS transistor coupled to ground; and a second NMOS transistor to discharge the complementary bit-line, a drain of the second NMOS transistor coupled to the complementary bit-line, a gate of the second NMOS transistor coupled to the read pulse signal line, and a source of the second NMOS transistor coupled to ground.

17. A system comprising:

a chipset; and a die comprising a microprocessor in communication with the chipset, wherein the microprocessor includes a circuit comprising:

a memory cell;

a bit-line coupled to the memory cell;

a complementary bit-line coupled to the memory cell;

a pre-charge circuit coupled to the bit-line and to the complementary bit-line to pre-charge the bit-line and the complementary bit-line to a reference voltage;

a device coupled to the bit-line to discharge the bit-line to a different voltage that is different from the reference voltage during a read operation; and a second device coupled to the complementary bit-line to discharge the complementary bit-line to the different voltage during the read operation, wherein only one of the bit-line and the complementary bit-line is discharged to a voltage that is less than the different voltage during the read operation.

18. A system according to claim 17, the microprocessor further comprising:

an NMOS transistor, a drain of the NMOS transistor coupled to the pre-charge circuit and to the bit-line, a gate of the NMOS transistor coupled to a read pulse signal line, and a source of the NMOS transistor coupled to ground.

* * * * *